(12) United States Patent
Miyamoto et al.

(10) Patent No.: US 9,186,696 B2
(45) Date of Patent: Nov. 17, 2015

(54) COATING APPARATUS INCLUDING A CHAMBER, SENSOR, REMOVAL UNIT AND CONTROL DEVICE FOR APPLICATION OF LIQUID TO A SUBSTRATE

(75) Inventors: Hidenori Miyamoto, Kawasaki (JP);
Kenji Maruyama, Kawasaki (JP);
Tadahiko Hirakawa, Kawasaki (JP);
Koichi Misumi, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 250 days.

(21) Appl. No.: 12/874,984

(22) Filed: Sep. 2, 2010

(65) Prior Publication Data
US 2011/0059245 A1   Mar. 10, 2011

(30) Foreign Application Priority Data

Sep. 8, 2009   (JP) .................................. 2009-207140

(51) Int. Cl.
*B05C 11/00* (2006.01)
*B05C 11/10* (2006.01)
*B05C 5/00* (2006.01)
(Continued)

(52) U.S. Cl.
CPC ............. *B05C 11/1015* (2013.01); *B05C 5/005* (2013.01); *C23C 16/52* (2013.01); *H01L 21/6715* (2013.01); *H01L 21/6776* (2013.01); *H01L 21/67173* (2013.01); *H01L 31/02167* (2013.01); *H01L 31/0322* (2013.01);
(Continued)

(58) Field of Classification Search
CPC .. B05B 12/0004; B05B 12/008; B05B 12/08; B05B 12/085; B05B 15/00; B05B 15/02; B05B 15/0275; B05B 15/004; B05B 2012/08; B05B 2012/12; C23C 16/52; C23C 18/1204; C23C 4/12; B41J 2/04566; B41J 2/20; H01L 31/0216; H01L 31/0322; B05C 11/105
USPC ............................ 118/64, 704, 679; 427/345
See application file for complete search history.

(56) References Cited

U.S. PATENT DOCUMENTS 3,148,084 A * 9/1964 Chamberlin et al. ........... 427/64
4,143,468 A   3/1979 Novotny et al.
(Continued)

FOREIGN PATENT DOCUMENTS

JP   H01-231313   9/1989
JP   A-05-050390   3/1993
(Continued)

OTHER PUBLICATIONS

Office Action issued in U.S. Appl. No. 12/875,613 on Aug. 3, 2012.
(Continued)

*Primary Examiner* — Dah-Wei Yuan
*Assistant Examiner* — Karl Kurple
(74) *Attorney, Agent, or Firm* — Knobbe Martens Olson & Bear LLP

(57) ABSTRACT

A coating apparatus including a coating part which applies a liquid material including an oxidizable metal on a substrate, a chamber having a coating space in which the coating part applies the liquid material on the substrate and a transport space into which the substrate is transported, and a removal unit which removes the liquid material from the inside of the chamber when at least one of oxygen concentration and humidity inside the chamber exceeds a threshold value.

4 Claims, 3 Drawing Sheets

(51) Int. Cl.
    *C23C 16/52* (2006.01)
    *H01L 21/67* (2006.01)
    *H01L 21/677* (2006.01)
    *H01L 31/0216* (2014.01)
    *H01L 31/032* (2006.01)
    *H01L 31/18* (2006.01)
    *B41J 2/045* (2006.01)

(52) U.S. Cl.
    CPC ............. *H01L31/18* (2013.01); *B41J 2/04566* (2013.01); *Y02E 10/541* (2013.01)

(56) References Cited

U.S. PATENT DOCUMENTS

| | | | |
|---|---|---|---|
| 4,150,494 A | 4/1979 | Rothchild | |
| 4,239,809 A * | 12/1980 | Lampkin et al. | 427/74 |
| 4,307,681 A * | 12/1981 | Lampkin et al. | 118/666 |
| 4,327,119 A * | 4/1982 | Lis et al. | 427/74 |
| 4,335,266 A * | 6/1982 | Mickelsen et al. | 136/260 |
| 4,336,285 A * | 6/1982 | Squillante | 427/314 |
| 4,557,868 A | 12/1985 | Page et al. | |
| 4,683,143 A | 7/1987 | Riley | |
| 4,793,283 A | 12/1988 | Sarkozy | |
| 4,832,986 A | 5/1989 | Gladfelter et al. | |
| 5,045,409 A | 9/1991 | Eberspacher et al. | |
| 5,140,937 A * | 8/1992 | Yamane et al. | 118/695 |
| 5,298,288 A * | 3/1994 | Curry et al. | 427/98.9 |
| 5,322,706 A | 6/1994 | Merkel et al. | |
| 5,325,705 A | 7/1994 | Tom | |
| 5,326,399 A * | 7/1994 | Takamura | 118/64 |
| 5,527,389 A * | 6/1996 | Rosenblum et al. | 118/58 |
| 5,725,644 A | 3/1998 | Sano et al. | |
| 5,814,132 A | 9/1998 | Grime et al. | |
| 5,912,043 A * | 6/1999 | Choi et al. | 427/8 |
| 5,916,625 A | 6/1999 | Rosenberger et al. | |
| 6,054,181 A | 4/2000 | Nanbu et al. | |
| 6,127,202 A | 10/2000 | Kapur et al. | |
| 6,161,311 A | 12/2000 | Doley et al. | |
| 6,165,272 A * | 12/2000 | Liu | 118/715 |
| 6,287,023 B1 | 9/2001 | Yaegashi et al. | |
| 6,296,806 B1 | 10/2001 | Kishkovich et al. | |
| 6,299,277 B1 * | 10/2001 | Fujii | 347/23 |
| 6,565,656 B2 | 5/2003 | Sada et al. | |
| 6,636,303 B2 | 10/2003 | Ina et al. | |
| 6,875,661 B2 | 4/2005 | Mitze | |
| 7,193,956 B2 | 3/2007 | Usami et al. | |
| 7,205,558 B2 | 4/2007 | Yoneyama et al. | |
| 7,364,775 B2 * | 4/2008 | Klein | 427/427.2 |
| 7,591,902 B2 * | 9/2009 | Rangarajan et al. | 118/326 |
| 7,638,001 B2 * | 12/2009 | Kawamura | 118/692 |
| 7,662,413 B2 * | 2/2010 | Wang et al. | 424/725 |
| 7,838,403 B1 * | 11/2010 | Liu et al. | 438/584 |
| 8,033,244 B2 | 10/2011 | Minamida et al. | |
| 8,062,922 B2 * | 11/2011 | Britt et al. | 438/95 |
| 2001/0000759 A1 | 5/2001 | Doley et al. | |
| 2001/0026747 A1 | 10/2001 | Saga | |
| 2003/0166311 A1 | 9/2003 | Miyazawa | |
| 2003/0215573 A1 | 11/2003 | Nishibayashi | |
| 2003/0235695 A1 | 12/2003 | Greenberg et al. | |
| 2004/0050321 A1 * | 3/2004 | Kitano et al. | 118/300 |
| 2004/0089414 A1 | 5/2004 | Makino et al. | |
| 2005/0175775 A1 | 8/2005 | Shirley | |
| 2005/0180744 A1 * | 8/2005 | Nakamura et al. | 396/618 |
| 2005/0217573 A1 | 10/2005 | Kwon et al. | |
| 2006/0029740 A1 | 2/2006 | Sakurai et al. | |
| 2006/0032440 A1 * | 2/2006 | Nolan | 118/715 |
| 2006/0119669 A1 * | 6/2006 | Sharma et al. | 347/82 |
| 2006/0124869 A1 | 6/2006 | Yoneyama et al. | |
| 2006/0138352 A1 | 6/2006 | Tanaka | |
| 2006/0172427 A1 | 8/2006 | Germouni et al. | |
| 2006/0207646 A1 * | 9/2006 | Terreau et al. | 136/251 |
| 2006/0263514 A1 * | 11/2006 | Shirley | 427/8 |
| 2007/0131246 A1 | 6/2007 | Izumi | |
| 2007/0160747 A1 | 7/2007 | Mitzi et al. | |
| 2007/0163644 A1 * | 7/2007 | Van Duren et al. | 136/262 |
| 2007/0166453 A1 | 7/2007 | Van Duren et al. | |
| 2007/0184178 A1 | 8/2007 | Yamamoto et al. | |
| 2007/0264504 A1 * | 11/2007 | Mitzi et al. | 428/411.1 |
| 2008/0139002 A1 * | 6/2008 | Kato | 438/782 |
| 2008/0190362 A1 * | 8/2008 | Takeuchi | 118/323 |
| 2009/0058915 A1 | 3/2009 | Hayashi et al. | |
| 2009/0117717 A1 | 5/2009 | Tomasini et al. | |
| 2009/0145482 A1 | 6/2009 | Mitzi et al. | |
| 2009/0205714 A1 | 8/2009 | Kühnlein et al. | |
| 2009/0239360 A1 | 9/2009 | Sato | |
| 2010/0022629 A1 | 1/2010 | Liu et al. | |
| 2010/0101489 A1 * | 4/2010 | Wurster | 118/326 |
| 2010/0189926 A1 | 7/2010 | DeLuca et al. | |
| 2010/0226629 A1 | 9/2010 | Basol et al. | |
| 2010/0300351 A1 * | 12/2010 | Yasui et al. | 118/58 |
| 2010/0326354 A1 * | 12/2010 | Sahoda et al. | 118/712 |
| 2011/0041913 A1 * | 2/2011 | Luecke et al. | 136/256 |
| 2011/0059246 A1 * | 3/2011 | Miyamoto et al. | 427/345 |
| 2011/0059248 A1 * | 3/2011 | Miyamoto et al. | 427/372.2 |
| 2011/0059250 A1 * | 3/2011 | Miyamoto et al. | 427/374.1 |
| 2011/0059574 A1 * | 3/2011 | Miyamoto et al. | 438/95 |
| 2011/0091655 A1 * | 4/2011 | Parling | 427/421.1 |
| 2011/0256656 A1 * | 10/2011 | Wang | 438/62 |
| 2012/0024223 A1 * | 2/2012 | Torres et al. | 117/104 |
| 2014/0295095 A1 * | 10/2014 | Langlois et al. | 427/482 |
| 2014/0324234 A1 * | 10/2014 | Hromadka et al. | 700/283 |

FOREIGN PATENT DOCUMENTS

| | | |
|---|---|---|
| JP | A-09-038484 | 2/1997 |
| JP | H11-273783 | 10/1999 |
| JP | H11-340482 | 12/1999 |
| JP | A-2001-203145 | 7/2001 |
| JP | A-2001-242471 | 9/2001 |
| JP | A-2004-164873 | 6/2004 |
| JP | A-2004-188407 | 7/2004 |
| JP | A-2004-195799 | 7/2004 |
| JP | 2005-051224 | 2/2005 |
| JP | 2005-175344 | 6/2005 |
| JP | A-2005-218931 | 8/2005 |
| JP | A-2005-244119 | 9/2005 |
| JP | A-2008-047222 | 2/2008 |
| JP | A-2009-011973 | 1/2009 |
| JP | A-2009-056367 | 3/2009 |
| JP | 2009-537997 | 10/2009 |

OTHER PUBLICATIONS

Office Action issued on Sep. 10, 2013 for Japanese Patent Application No. 2009-207140.
Office Action issued on Sep. 10, 2013 for Japanese Patent Application No. 2009-207141.
Office Action issued in U.S. Appl. No. 12/874,117 on Oct. 12, 2012.
Office Action issued in U.S. Appl. No. 12/875,613 on Jan. 30, 2013.
Notice of Allowance issued on Mar. 18, 2013 in U.S. Appl. No. 12/874,117.
Office Action issued in Japanese Patent Application No. 2010-182317 on Jul. 8, 2014.
Office Action in Japanese Patent Application No. 2010-182317 mailed on Nov. 25, 2014.
Office Action in U.S. Appl. No. 12/875613 mailed on Jan. 20, 2015.
Final Office Action in U.S. Appl No. 12/875,613, mailed Jul. 15, 2015.

* cited by examiner

COATING APPARATUS INCLUDING A CHAMBER, SENSOR, REMOVAL UNIT AND CONTROL DEVICE FOR APPLICATION OF LIQUID TO A SUBSTRATE

FIELD OF THE INVENTION

The present invention relates to a coating apparatus and a coating method.

DESCRIPTION OF THE RELATED ART

A CIGS solar cell formed by semiconductor materials including a metal such as Cu, Ge, Sn, Pb, Sb, Bi, Ga, In, Ti, and a combination thereof, and a chalcogen element such as S, Se, Te, and a combination thereof has been attracting attention as a solar cell having high conversion efficiency (for example, see Patent Documents 1 and 2). For example, a CIGS solar cell has a structure in which a film including four types of semiconductor materials, namely, Cu, In, Ga, and Se is used as a light absorbing layer (photoelectric conversion layer).

In a CIGS solar cell, since it is possible to reduce the thickness of the light absorbing layer compared to a conventional solar cell, it is easy to install the CIGS solar cell on a curved surface and to transport the CIGS solar cell. For this reason, it is expected that CIGS solar cells can be used in various application fields as a high-performance, flexible solar cell. As a method of forming the light absorbing layer, a method of forming the light absorbing layer through depositing or sputtering is conventionally known (for example, see Patent Documents 2 to 4).

DOCUMENTS OF RELATED ART

Patent Documents

[Patent Document 1] Japanese Unexamined Patent Application, First Publication No. Hei 11-340482
[Patent Document 2] Japanese Unexamined Patent Application, First Publication No. 2005-51224
[Patent Document 3] Japanese Unexamined Patent Application, First Publication No. Hei 1-231313
[Patent Document 4] Japanese Unexamined Patent Application, First Publication No. Hei 11-273783
[Patent Document 5] Japanese Unexamined Patent Application, First Publication No. 2005-175344

By contrast, as the method of forming the light absorbing layer, the present inventor propose a method of coating the semiconductor materials in the form of a liquid material on a substrate. In such a method of forming the light absorbing layer by coating the semiconductor materials in the form of a liquid material, the following problems arise.

Among the semiconductor materials, Cu, In, and the like are metals susceptible to oxidation (i.e., oxidizable metals). When a liquid material including such oxidized metals is coated on the substrate under the conditions in which the oxygen concentration or humidity is high, the oxidizable metal is likely to be oxidized, which may cause deterioration in the film quality of the coating film. This problem is not limited to the case of forming a semiconductor film of a CIGS solar cell, but may generally arise in a coating operation using a liquid material including the oxidizable metals.

In order to solve the above-described problem, for example, as described in Patent Document 5, a technology has been proposed in which a main chamber is maintained in a hermetic state by a nitrogen-circulation cleaning unit and nitrogen is circulated via a high-performance filter so as to maintain a clean state. However, since a coating operation is performed using an organic material such as a photoresist as a target solution and metal is not a main component thereof, it is difficult to solve the above-described problem.

SUMMARY OF THE INVENTION

The present invention takes the above circumstances into consideration, with an object of providing a coating apparatus and a coating method capable of suppressing deterioration in film quality of a coating film including oxidizable metal.

The coating apparatus of the present invention includes a coating part which applies a liquid material including an oxidizable metal to a substrate; a chamber having a coating space in which the coating part applies the liquid material to the substrate and a transport space into which the substrate is transported; and a removal unit which removes the liquid material from the inside of the chamber when at least one of oxygen concentration and humidity inside the chamber exceeds a threshold value.

According to the present invention, since the coating apparatus includes a removal unit which removes the liquid material from the inside of the chamber when at least one of oxygen concentration and humidity inside the chamber exceeds a threshold value, deterioration of the liquid material caused by the influence of oxygen and moisture can be prevented. As a result, it is possible to prevent deterioration in film quality of the coating film formed using the liquid material.

In the coating apparatus, the removal unit may include a recovery part which recovers the removed liquid material.

In this embodiment, by virtue of the recovery part recovering the removed liquid material, waste of the removed liquid material can be prevented.

In the coating apparatus, the recovery part may include a circulation path which returns the recovered liquid material into the chamber.

In this embodiment, by virtue of the recovery part including a circulation path which returns the recovered liquid material into the chamber, the recovered liquid material can be effectively reused.

In the coating apparatus, the removal unit may include a discharge unit which discharges oxygen or moisture from the chamber, depending on which of the at least one of oxygen concentration and humidity inside the chamber exceeds a threshold value.

In this embodiment, by virtue of the discharge unit which discharges oxygen or moisture from the chamber, depending on which of the at least one of oxygen concentration and humidity inside the chamber exceeds a threshold value, deteriorated liquid material can be discharged. In this manner, liquid material which has not been deteriorated can be selectively separated for use.

In the coating apparatus, the removal unit may include a control device which controls the removal unit to wait removing the liquid material until the coating part finishes treating the liquid material which was applied to the substrate when the at least one of oxygen concentration and humidity exceeds the threshold value.

In this embodiment, since the removal unit is controlled to wait removing the liquid material until the coating part finishes treating the liquid material which was applied to the substrate when the at least one of oxygen concentration and humidity exceeds the threshold value, the treatment to the substrate can be prevented from being stopped before being completed. In this manner, a waste of the substrate can be prevented.

In the coating apparatus, the control device may stop the substrate which has finished being treated from being transported to the coating part.

In this embodiment, by virtue of stopping the substrate which has finished being treated from being transported to the coating part, the substrate can be prevented from being coated with deteriorated liquid material. As a result, decrease in the yield can be prevented.

In the coating apparatus, the control device may control the removal unit to wait removing the liquid material until the coating part is moved to a maintenance position after the substrate has been finished being treated.

In this embodiment, by controlling the removal unit to wait removing the liquid material until the coating part is moved to a maintenance position after the substrate has been finished being treated, for example, even when dripping of the liquid material occurs in the coating part after the treatment, adhesion of the liquid material on the treatment position of the substrate can be prevented, and the liquid material can be reliably recovered.

In the coating apparatus, the control device may stop all treatments associated with coating of the liquid material when the at least one of oxygen concentration and humidity exceeds a second threshold value which is larger than the threshold value.

In this embodiment, when the at least one of oxygen concentration and humidity exceeds a second threshold value which is larger than the threshold value, the liquid material is removed after stopping the operation of the apparatus. When the oxygen concentration or the humidity becomes high, it is sometimes preferable to perform an emergency stop of the apparatus itself prior to removing the liquid material. In this manner, the liquid material can be more reliably recovered while maintaining the properties of the coating film of the liquid material.

In the coating apparatus, the coating part may include a slit nozzle which ejects the liquid material.

In this embodiment, deterioration of the liquid material ejected from the slit nozzle can be prevented, and a coating film with a high quality can be formed promptly.

The coating method according to the present invention includes coating a liquid material including an oxidizable metal on a substrate (coating step); and removing the liquid material from the inside of a chamber when at least one of oxygen concentration and humidity inside the chamber exceeds a threshold value (removing step), the chamber having a coating space in which the coating part applies the liquid material on the substrate and a transport space into which the substrate is transported.

In the coating method according to the present invention, by removing the liquid material from the inside of the chamber (which has a coating space in which the coating part applies the liquid material on the substrate and a transport space into which the substrate is transported) when at least one of oxygen concentration and humidity inside the chamber exceeds a threshold value, deterioration of the liquid material caused by the influence of oxygen and moisture can be prevented. As a result, it is possible to prevent deterioration in the film quality of the coating film formed using the liquid material.

In the coating method, the removing step may include recovering the removed liquid material (recovering step).

In this embodiment, by recovering the liquid material in the removing step, waste of the removed liquid material can be prevented.

In the coating method, the recovering step may include returning the recovered liquid material into the chamber (returning step).

In this embodiment, by returning the removed liquid material into the chamber in the recovering step, the recovered liquid material can be effectively reused.

In the coating method, the removing step may include discharging oxygen or moisture from the chamber, depending on which of the at least one of oxygen concentration and humidity inside the chamber exceeds a threshold value (discharging step).

In this embodiment, by discharging oxygen or moisture from the chamber in the removing step, depending on which of the at least one of oxygen concentration and humidity inside the chamber exceeds a threshold value, deteriorated liquid material can be discharged. In this manner, liquid material which has not been deteriorated can be selectively separated for use.

In the coating method, the removing step may be performed after the coating part finishes treating the liquid material which was applied to the substrate when the at least one of oxygen concentration and humidity exceeds the threshold value.

In this embodiment, by waiting the removal of the liquid material until the coating part finishes treating the liquid material which was applied to the substrate when the at least one of oxygen concentration and humidity exceeds the threshold value, the treatment to the substrate can be prevented from being stopped before being completed. In this manner, a waste of the substrate can be prevented.

In the coating method, the removing step may include stopping the substrate which has finished being treated from being transported to the coating part.

In this embodiment, by stopping the substrate which has finished being treated from being transported to the coating part in the removing step, the substrate can be prevented from being coated with deteriorated liquid material. As a result, decrease in the yield can be prevented.

In the coating method, the removing step may be performed after the coating part is moved to a maintenance position after the substrate has been finished being treated.

In this embodiment, by performing the removing step after the coating part is moved to a maintenance position after the substrate has been finished being treated, for example, even when leaking of the liquid material occurs in the coating part after the treatment, adhesion of the liquid material on the treatment position of the substrate can be prevented, and the liquid material can be reliably recovered.

In the coating method, the removing step may include stopping all treatments associated with coating of the liquid material when the at least one of oxygen concentration and humidity exceeds a second threshold value which is larger than the threshold value.

In this embodiment, when, in the removing step, the at least one of oxygen concentration and humidity exceeds a second threshold value which is larger than the threshold value, the liquid material is removed after stopping the operation of the apparatus. When the oxygen concentration or the humidity becomes high, it is sometimes preferable to perform an emergency stop of the apparatus itself prior to removing the liquid material. In this manner, the liquid material can be more reliably recovered while maintaining the properties of the coating film of the liquid material.

In the coating method, the coating step may include ejecting the liquid material from a slit nozzle.

In this embodiment, deterioration of the liquid material ejected from the slit nozzle can be prevented in the coating step, and a coating film with a high quality can be formed promptly.

Thus, according to the present invention, it is possible to suppress deterioration in the film quality of the coating film.

DETAILED DESCRIPTION OF THE INVENTION

Figure 1:
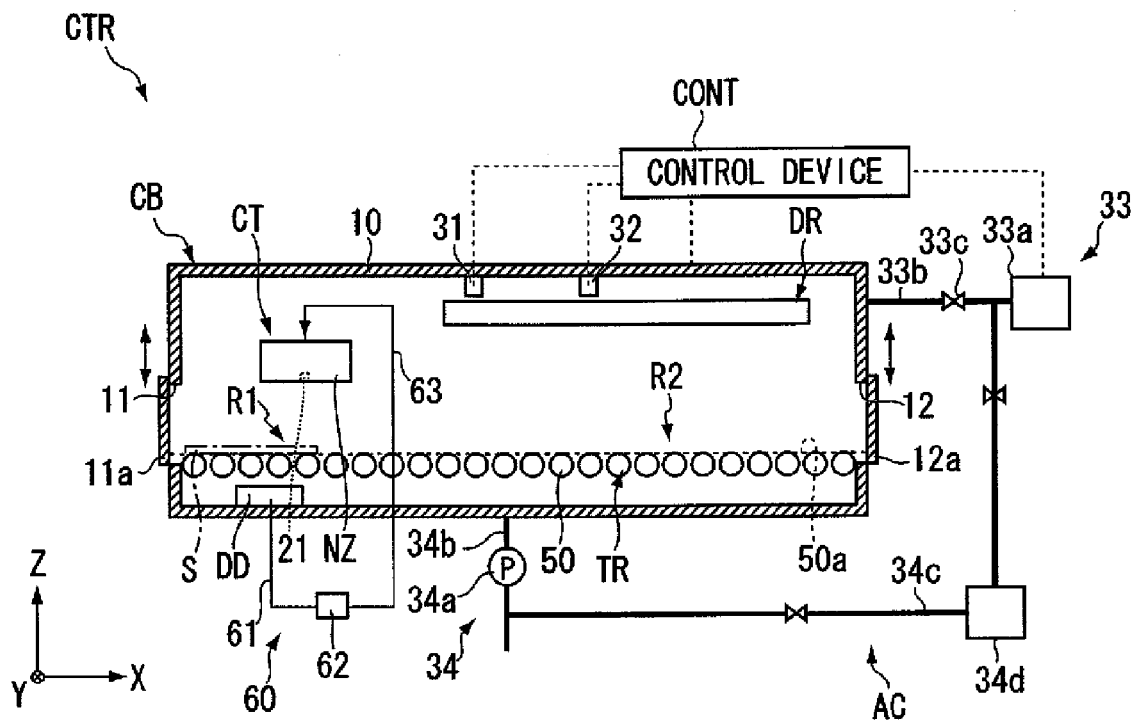
FIG. 1 is a diagram showing a configuration of a coating apparatus according to one embodiment of the present invention.

Hereinafter, one embodiment of the present invention will be described with reference to the accompanying drawings.

In the respective drawings as below, upon describing the configuration of a coating apparatus, for the purpose of simple marking, an XYZ coordinate system is used to describe the directions in the drawings. In the XYZ coordinate system, the horizontal direction in the drawing is marked as the X direction, and the direction perpendicular to the X direction in a plan view is marked as the Y direction. The direction perpendicular to a plane including the X and Y axes is marked as the Z direction. In the X, Y, and Z directions, the arrow direction in the drawing is the +direction, and the opposite direction of the arrow direction is the −direction.

[Coating Apparatus]

FIG. 1 is a schematic diagram showing a configuration of a coating apparatus CTR according to one embodiment of the present invention.

As shown in FIG. 1, the coating apparatus CTR includes a chamber CB, a coating part CT, a application condition adjusting part AC, a drying part DR, a substrate transporting part TR, a removal unit 60 and a control device CONT. The coating apparatus CTR is an apparatus which applies a liquid material on a substrate S inside the chamber CB.

In this embodiment, as the liquid material, for example, a liquid composition is used which includes a solvent such as hydrazine and oxidizable metals such as copper (Cu), indium (In), gallium (Ga), and selenium (Se). The liquid composition includes a metal material for forming a light absorbing layer (photoelectric conversion layer) of a CIGS solar cell. Needless to say, as the liquid material, a liquid material in which another oxidizable metal is dispersed in the solution may be used. In this embodiment, as the substrate S, for example, a plate-shaped member made of glass, resin, or the like may be used.

(Chamber)

The chamber CB includes a housing 10, a substrate loading opening 11, and a substrate unloading opening 12. The housing 10 is adapted to accommodate the substrate S. The substrate loading opening 11 and the substrate unloading opening 12 are openings formed in the housing 10. The substrate loading opening 11 is formed in, for example, the −X-direction-side end portion of the housing 10. The substrate unloading opening 12 is formed in, for example, the +X-direction-side end portion of the housing 10. The substrate loading opening 11 and the substrate unloading opening 12 are connected to, for example, a load lock chamber (not shown).

The substrate loading opening 11 is provided with a shutter member 11a. The shutter member 11a is adapted to be movable in the Z direction, and is adapted to open or close the substrate loading opening 11. The substrate unloading opening 12 is provided with a shutter member 12a. In the same manner as the shutter member 11a, the shutter member 12a is adapted to be movable in the Z direction, and is adapted to open or close the substrate unloading opening 12. When the shutter members 11a and 12a are both in a closed state, the inside of the chamber CB is hermetically closed. FIG. 1 shows the state in which the shutter members 11a and 12a are closed.

(Coating Part)

The coating part CT is accommodated in the housing 10 of the chamber CB. The coating part CT includes a slit nozzle NZ which is formed in an elongated shape. The slit nozzle NZ is provided, for example, in the vicinity of the substrate loading opening 11 inside the chamber CB. The slit nozzle NZ is formed to be elongated in, for example, the Y direction.

Figure 2:
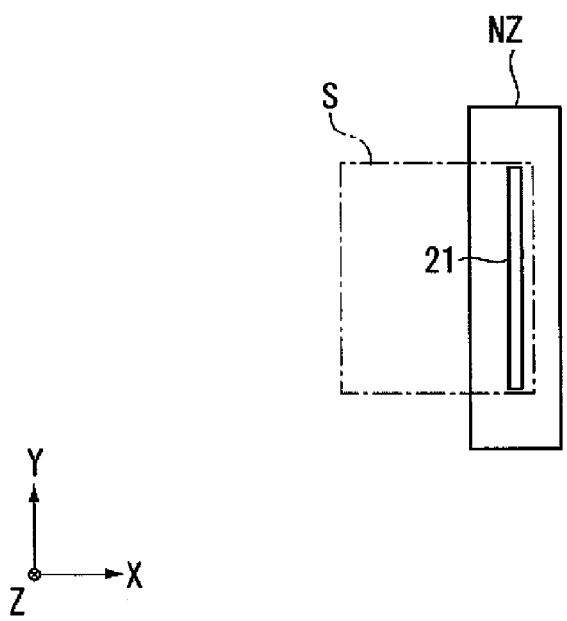
FIG. 2 is a diagram showing a configuration of a part of the coating apparatus according to one embodiment of the present invention.

FIG. 2 is a diagram showing a configuration of the slit nozzle NZ. FIG. 2 shows the configuration when the slit nozzle NZ is viewed from the −Z direction side thereof to the +Z direction side thereof.

As shown in FIG. 2, the slit nozzle NZ has a nozzle opening 21. The nozzle opening 21 is an opening for ejecting a liquid material. The nozzle opening 21 is formed in, for example, the Y direction so as to follow the longitudinal direction of the slit nozzle NZ. The nozzle opening 21 is formed, for example, so that the longitudinal direction thereof is substantially equal to the Y-direction dimension of the substrate S.

The slit nozzle NZ ejects, for example, a liquid material in which four types of metals, namely, Cu, In, Ga, and Se are mixed with a predetermined composition ratio. The slit nozzle NZ is connected to a supply source (not shown) of the liquid material via a connection pipe (not shown). The slit nozzle NZ includes a holding portion which holds the liquid material therein. The slit nozzle NZ includes a temperature controlling mechanism (not shown) which controls the temperature of the liquid material held by the holding portion.

The slit nozzle NZ is provided with, for example, a moving mechanism (not shown) which is adapted to be movable between, for example, a standby position (for example, a position shown in FIG. 6) and a coating position (a position shown in FIG. 1) inside the chamber CB. The standby position of the slit nozzle NZ is provided with, for example, a dummy ejection mechanism DD which conducts a dummy ejection of the liquid material. The dummy ejection mechanism is provided with, for example, a bubble sensor (not shown) which detects a bubble of the liquid material.

(Application Condition Adjusting Part)

Returning to FIG. 1, the application condition adjusting part AC includes an oxygen concentration sensor 31, a pressure sensor 32, an inert gas supply part 33, and a discharge part 34.

The oxygen concentration sensor 31 detects the oxygen concentration inside the chamber CB, and transmits the detection result to the control device CONT. The pressure sensor 32 detects a pressure inside the chamber CB, and transmits the detection result to the control device CONT. There may be plural numbers of the oxygen concentration sensors 31 and the pressure sensors 32. In FIG. 1, the oxygen concentration sensor 31 and the pressure sensor 32 are mounted to the ceiling portion of the housing 10 of the chamber CB, although they may be provided in other portions.

The inert gas supply part 33 supplies, for example, an inert gas such as nitrogen gas or argon gas to the inside of the housing 10 of the chamber CB. The inert gas supply part 33 includes a gas supply source 33a, a conduit 33b, and a supply amount adjusting part 33c. As the gas supply source 33a, for example, a gas cylinder or the like may be used.

One end of the conduit 33b is connected to the gas supply source 33a, and the other end thereof is connected to the inside of the housing 10 of the chamber CB. The end portion of the conduit 33b connected to the chamber CB is an inert gas supply port in the chamber CB. The inert gas supply port is disposed on the +Z direction side of the housing 10.

The supply amount adjusting part 33c is a part which adjusts the amount of the inert gas supplied to the inside of the housing 10. As the supply amount adjusting part 33c, for example, an electromagnetic valve or a valve which is manually opened or closed may be used. The supply amount adjusting part 33c is provided in, for example, the conduit 33b. The supply amount adjusting part 33c may be directly installed in, for example, the gas supply source 33a, instead of disposing in the conduit 33b.

The discharge part 34 discharges a gas inside the housing 10 of the chamber CB to the outside of the housing 10. The discharge part 34 includes a discharge driving source 34a, a conduit 34b, a conduit 34c, and a removing member 34d. The discharge driving source 34a is connected to the inside of the housing 10 via the conduit 34b. As the discharge driving source 34a, for example, a pump or the like may be used. The conduit 34b has a discharge port which is provided in an end portion thereof provided inside the housing 10. The discharge port is disposed on the −Z direction side of the housing 10.

By such a configuration in which the inert gas supply port is disposed on the +Z direction side of the housing 10 and the discharge port is disposed on the −Z direction side of the housing 10, the gas inside the housing 10 flows in the −Z direction. In this manner, it is possible to suppress the gas inside the housing 10 from whirling around.

One end of the conduit 34c is connected to the discharge driving source 34a, and the other end thereof is connected to the conduit 33b of the inert gas supply part 33. The conduit 34c is used as a circulation path which circulates the gas discharged by the discharge driving source 34a from the inside of the housing 10 to the supply path. In this manner, the discharge part 34 is also used as a circulating mechanism which circulates the gas inside the housing 10. The connection portion of the conduit 34c is not limited to the conduit 33b of the inert gas supply part 33, but for example, the conduit 34c may be directly connected to the inside of the housing 10. In the conduit 34c, for example, valves are respectively provided on the upstream side and the downstream side of a removing member 34d.

The removing member 34d is provided inside the conduit 34c. As the removing member 34d, for example, an absorbing material for absorbing an oxygen component and moisture contained in the gas circulating in the conduit 34c is used. In this manner, it is possible to clean the circulated gas. The removing member 34d may be disposed at one position inside the conduit 34c, or may be disposed throughout the conduit 34c.

(Drying Part)

The drying part DR is a part which dries the liquid material coated on the substrate S. The drying part DR includes a heating mechanism such as an infrared unit. The drying part DR is adapted to heat and dry the liquid material by using the heating mechanism. The drying part DR is provided at a position not overlapping with the nozzle NZ in plan view. More specifically, the drying part DR is disposed on the +X direction side of the slit nozzle NZ. For this reason, the action of the drying part DR (e.g., irradiation of infrared ray) hardly influences the slit nozzle NZ, and thus the liquid material inside the slit nozzle NZ is hardly dried. By such a configuration in which the drying part DR is not disposed on the +Z direction side of the slit nozzle NZ, it is possible to prevent clogging of the nozzle opening 21 formed in the nozzle NZ, thereby preventing a change in quality of the liquid composition including the oxidizable metal materials.

(Substrate Transporting Part)

The substrate transporting part TR is a part which transports the substrate S inside the housing 10. The substrate transporting part TR includes a plurality of roller members 50. The roller members 50 are arranged in the X direction from the substrate loading opening 11 to the substrate unloading opening 12. Each roller member 50 is adapted to be rotatable about the Y direction serving as the central axis.

The plurality of roller members 50 are disposed at the same position in the Z direction. The +Z-direction-side upper ends of the roller members 50 are adapted to support the substrate S. For this reason, the support positions of the roller members 50 are formed on the same plane, and a transporting plane 50a for the substrate S is formed by the plural roller members 50.

The transporting plane 50a for the substrate S is formed so that a loading position of the substrate S at the substrate loading opening 11 and an unloading position of the substrate S at the substrate unloading opening 12 are equal to each other in the Z direction. In this manner, the substrate S is reliably transported from the substrate loading opening 11 to the substrate unloading opening 12 without any change in the Z-direction position thereof.

In the space above the substrate transporting plane 50a inside the chamber CB, a space on the −Z direction side of the slit nozzle NZ becomes a coating space R1 where the liquid material is applied on the substrate S. In the space above the substrate transporting plane 50a inside the chamber CB, a space on the +X direction side of the slit nozzle NZ becomes a transport space R2 (transporting space R2) where the substrate S coated with the liquid material is transported.

(Removal Unit)

The removal unit 60 has a connection part 61, a recovery part 62 and a circulation part 63.

The connection part 61 is a conduit having one end connected to the bottom of the dummy ejection mechanism DD and the other end connected to the recovery part 62. The dummy ejection DD-end of the connection part 61 is connected to, for example, the dummy ejection mechanism of the slit nozzle NZ. The connection part 61 is provided with, for example, a pumping mechanism (not shown) (e.g., a suction pump) and a valve (not shown) within the flow path thereof. By opening the valve to drive the pumping mechanism, suction can be conducted on the bottom of the dummy ejection mechanism DD. In FIG. 1, the connected portion of the connection part 61 is positioned in substantially middle of the chamber CB in the X direction, but there is no particular limitation. For example, the connected portion may be at a position overlapping the slit nozzle NZ in the X direction.

The recovery part 62 is connected to the connection part 61, and a substance suctioned from the bottom of the dummy ejection mechanism DD is supplied thereto. The recovery part 62 has a liquid material reservoir (not shown). The liquid material discharged from the connection part 61 can be temporary stored in the liquid material reservoir. The recovered liquid material (i.e., liquid material inside the liquid material reservoir) is supplied to the circulation part 63.

The circulation part 63 has one end connected to the recovery part 62, and the other end connected to the slit nozzle NZ. The circulation part 63 is a liquid conduit which allows the liquid material recovered by the recovering part 62 to flow to the slit nozzle NZ. The circulation part 63 is provided with, for example, a pumping mechanism (not shown) (e.g., a suction pump) and a valve (not shown) within the flow path thereof. By opening the valve to drive the pumping mechanism, the liquid material can be supplied from the recovery part 62 to the slit nozzle NZ via the circulation part 63.

(Control Device)

The control device CONT is a part which has the overall control of the coating apparatus CTR. More specifically, the control device CONT controls, for example, an opening-closing operation using the shutter members 11a and 12a of the chamber CB, a transporting operation using the substrate transporting part TR, a coating operation using the coating part CT, a drying operation using the drying part DR, an adjusting operation using the application condition adjusting part AC, and an operation of the removal unit 60. As an example of the adjusting operation, the control device CONT controls an opening degree of the supply amount adjusting part 33c of the inert gas supply part 33 on the basis of the detection result obtained by the oxygen concentration sensor 31 and the pressure sensor 32, and/or controls the recovering operation of the recovery part 62. The control device has a timer or the like (not shown) for measuring the treatment time.

[Coating Method]

Next, a coating method according to one embodiment of the present invention will be described. In this embodiment, a coating film is formed on the substrate S by using the coating apparatus CTR having the above-described configuration. The operations performed by the respective portions of the coating apparatus CTR are controlled by the control device CONT.

The control device CONT adjusts the atmosphere inside the chamber CB to be an inert gas atmosphere. More specifically, an inert gas is supplied to the inside of the chamber CB by using the inert gas supply part 33. In this case, the control device CONT may adjust the pressure inside the chamber CB by appropriately operating the discharge part 34.

In addition, the control device CONT controls the holding portion of the slit nozzle NZ to hold the liquid material therein. The control device CONT controls the temperature of the liquid material held by the holding portion by using the temperature controlling mechanism inside the slit nozzle NZ. In this manner, the control device CONT controls the slits nozzle NZ so as to be in a state capable of ejecting the liquid material to the substrate S.

When the coating apparatus CTR is in the state capable of ejecting the liquid material to the substrate S, the control device CONT loads the substrate S from the load lock chamber into the chamber CB. More specifically, the control device CONT moves up the shutter member 11a of the substrate loading opening 11, and loads the substrate S into the chamber CB via the substrate loading opening 11.

Figure 3:
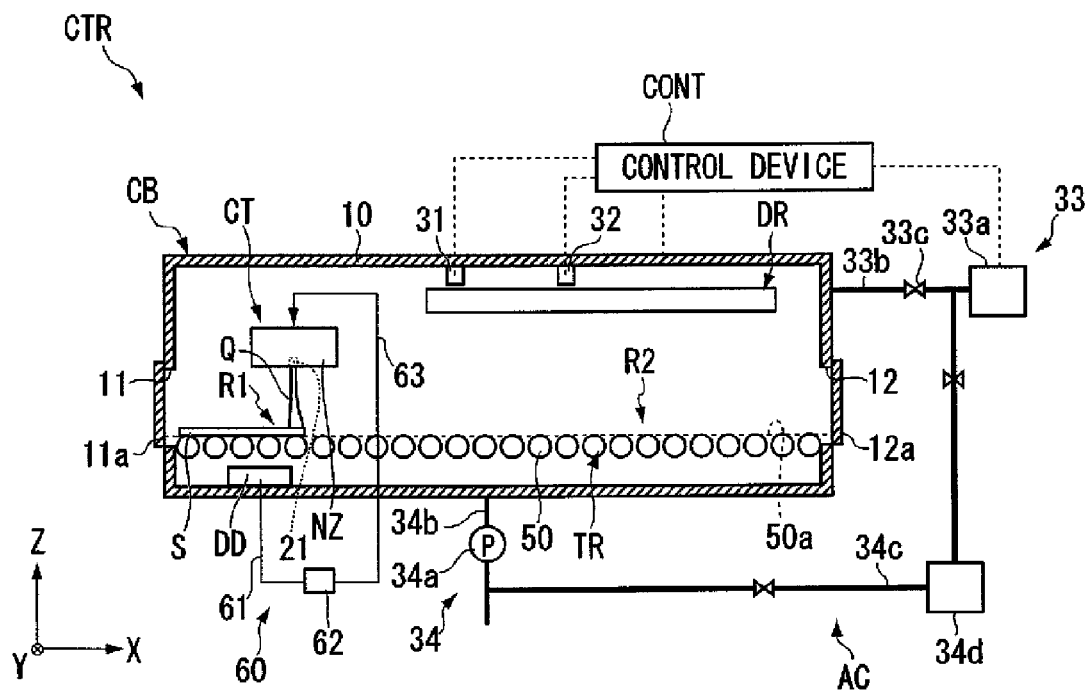
FIG. 3 is a diagram showing an operation of the coating apparatus according to one embodiment of the present invention.

After the substrate S is loaded into the chamber CB, the control device CONT rotates the roller members 50 of the substrate transporting part TR so as to move the substrate S in the +X direction. When the +X-direction-side edge of the substrate S arrives at a position overlapping with the nozzle opening 21 of the slit nozzle NZ as viewed from the Z direction, as shown in FIG. 3, the control device CONT operates the slit nozzle NZ so as to eject a liquid material Q from the nozzle opening 21.

Figure 4:
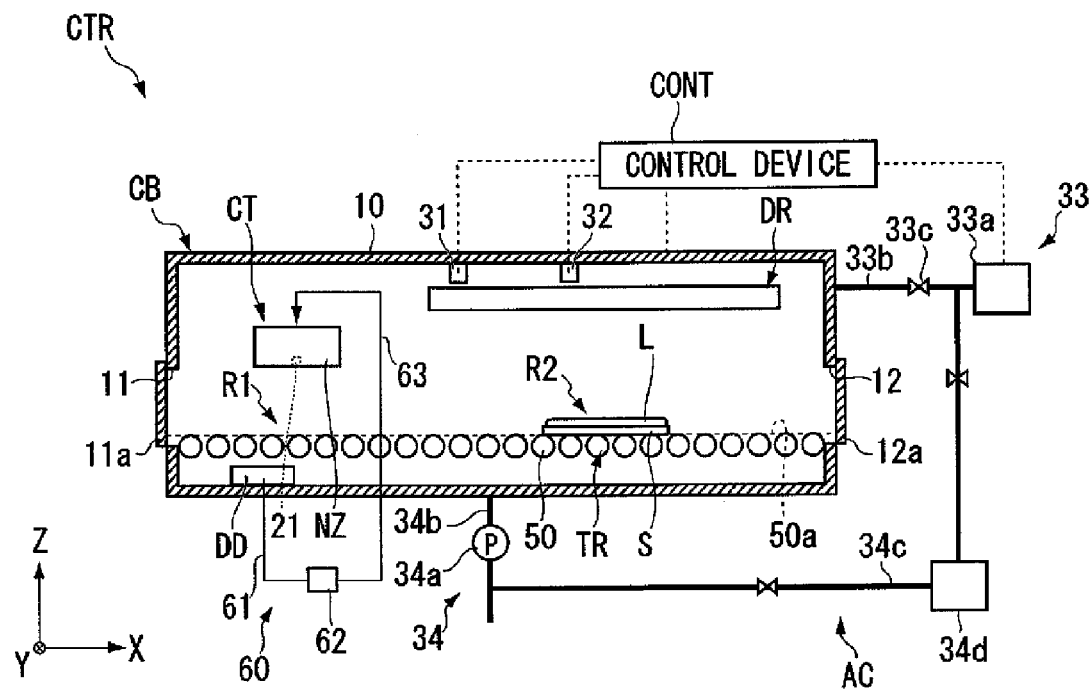
FIG. 4 is a diagram showing an operation of the coating apparatus according to one embodiment of the present invention.

The control device CONT rotates the roller members 50 while ejecting the liquid material Q from the nozzle opening 21 in the state where the position of the slit nozzle NZ is fixed. By this operation, the liquid material is coated on the substrate S from the +X direction side thereof to the −X direction side thereof in accordance with the movement of the substrate S. As shown in FIG. 4, a coating film L of the liquid material is formed on a predetermined area of the substrate S (coating step). After the coating film L is formed on the substrate S, the control device CONT stops the operation of ejecting the liquid material from the nozzle opening 21.

Figure 5:
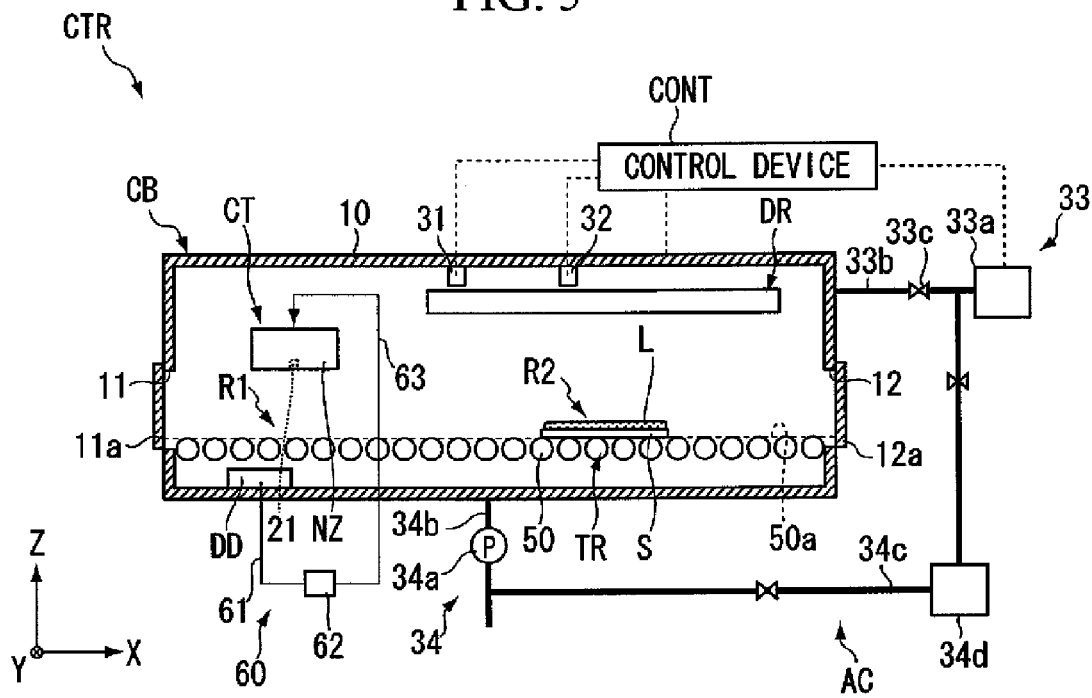
FIG. 5 is a diagram showing an operation of the coating apparatus according to one embodiment of the present invention.

After the ejecting operation stops, as shown in FIG. 5, the control device CONT operates the drying part DR so as to dry the coating film on the substrate S (drying step). The control device CONT, for example, stops the rotation operation of the roller members 50, and operates the drying part DR while the substrate S is in a stationary state. For example, the time required for drying the coating film L on the substrate S and/or the drying temperature is memorized in advance, and the control device CONT performs a drying operation of the coating film L by controlling the drying time and the drying temperature on the basis of the memorized values.

In the case where a part of a light absorbing layer is formed by coating the liquid material Q including oxidizable metals on the substrate S, for example, since Cu, In and the like are metals which are susceptible to oxidation (oxidizable metals), when the oxygen concentration inside the chamber CB is high, the oxidizable metals are oxidized. When the metals are oxidized, the film quality of the coating film formed on the substrate S may deteriorate.

In one embodiment of the present invention, the control device CONT adjusts the oxygen concentration inside the chamber CB by using the application condition adjusting part AC. More specifically, the control device CONT supplies an inert gas to the inside of the chamber CB by using the inert gas supply part 33 (inert gas supplying step).

In the inert gas supplying step, the control device CONT first detects the oxygen concentration inside the chamber CB by using the oxygen concentration sensor 31. The control device CONT adjusts the inert gas supply amount by using the supply amount adjusting part 33c on the basis of the detection result obtained in the detecting step, and supplies the inert gas to the inside of the chamber CB. For example, when the detected oxygen concentration exceeds a predetermined threshold value, it is possible to supply the inert gas into the chamber CB. The threshold value may be obtained in advance by a test or simulation, and may be stored in the control device CONT. In addition, for example, a predetermined amount of the inert gas may be constantly supplied into the chamber CB during the coating operation and the drying operation, and the inert gas supply amount can be increased or decreased on the basis of the detection result of the oxygen concentration sensor 31.

In the inert gas supplying step, the control device CONT uses the oxygen concentration sensor 31, and also detects the atmospheric pressure inside the chamber CB by using the pressure sensor 32. The control device CONT supplies the inert gas to the inside of the chamber CB while adjusting the gas supply amount of the inert gas by using the supply amount adjusting part 33c on the basis of the detection result of the pressure sensor 32. For example, when the atmospheric pressure inside the chamber CB exceeds a predetermined threshold value, the gas inside the chamber CB is discharged by using the discharge part 34. This threshold value may be obtained in advance by a test or simulation, and may be stored in the control device CONT. In addition, for example, a predetermined amount of the gas inside the chamber CB may be constantly discharged during the coating operation and the drying operation, and the discharge amount can be increased or decreased on the basis of the detection result of the pressure sensor 32.

The gas discharged from the discharge part 34 is circulated to the conduit 33b of the inert gas supply part 33 via the conduits 34b and 34c. When the gas flows through the conduit 34c, the gas passes through the removing member 34d. When the gas passes through the removing member 34d, the oxygen component in the gas is adsorbed by the removing member 34d so as to be removed from the gas. In this manner, an inert gas having a low oxygen concentration is circulated to the conduit 33b. By circulating the gas inside the chamber CB, it becomes possible to supply the inert gas under stable temperature conditions.

In another embodiment of the present invention, the control device CONT removes the liquid material inside the chamber CB from oxygen atmosphere by using the removal unit 60 when the oxygen concentration inside the chamber CB exceeds a predetermined threshold value (removing step). In the removing step, a first threshold value and a second threshold value are predetermined. The first threshold value indicates a slight excess in the level of the oxygen concentration inside the chamber CB, and the second threshold value indicates a serious excess in the level of the oxygen concentration.

Firstly, the control device CONT detects the oxygen concentration inside the chamber CB by using the oxygen concentration sensor 31. When the oxygen concentration exceeds the first threshold value (when the oxygen concentration satisfies the requirement: first threshold value<oxygen concentration<second threshold value), the control device CONT transports the substrate S outside the chamber CB, so that the substrate S is not disposed inside the chamber CB. In the case where coating of the substrate S is being conducted by the slit nozzle NZ when the oxygen concentration exceeds the first threshold value, the substrate S is transported outside the chamber CB after the coating of the substrate S is completed. By this operation, the substrate S can be prevented from being transported outside the chamber CB before the coating operation is completed, thereby preventing a waste of the substrate S. The coating apparatus is controlled such that a new substrate S will not be loaded after transporting the substrate S outside the chamber.

Figure 6:
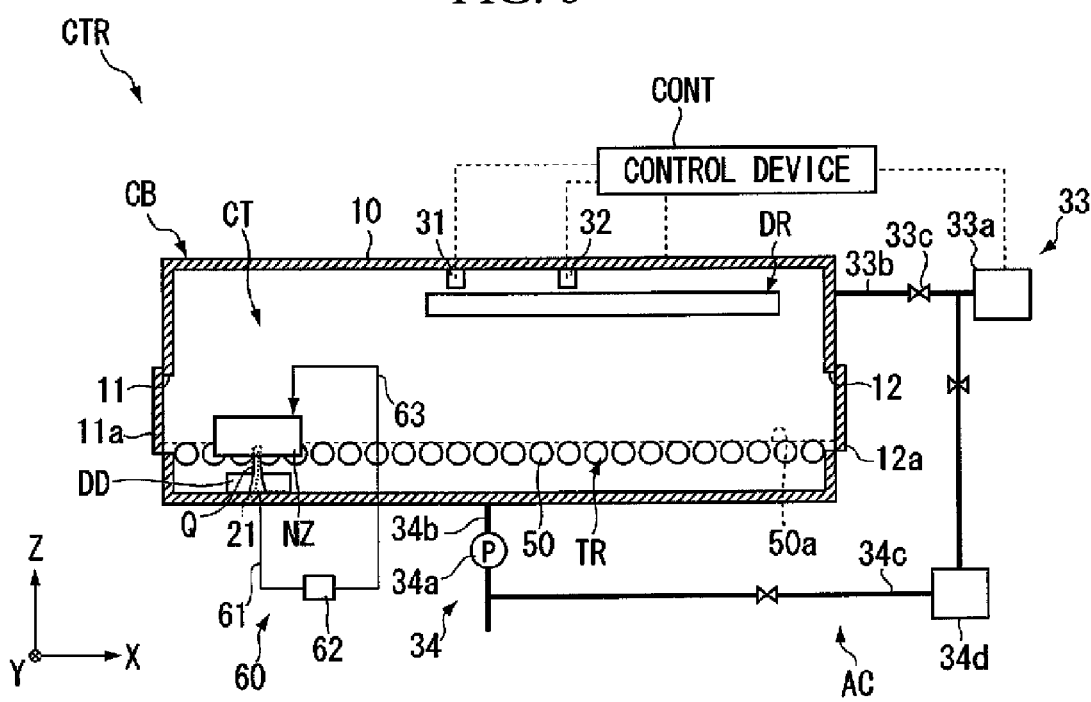
FIG. 6 is a diagram showing an operation of the coating apparatus according to one embodiment of the present invention.

When the substrate S is no longer disposed inside the chamber CB, the control device CONT discharges the liquid material inside the slit nozzle NZ to the outside of the dummy ejection mechanism DD. In this operation, as shown in FIG. 6, the control device CONT first moves the slit nozzle NZ to a dummy ejection position. After moving the slit nozzle, the control device CONT discharges the liquid material form the slit nozzle NZ at the dummy ejection position. In this case, for example, the control device CONT closes the supply path of the liquid material so that no more liquid material would be supplied to the slit nozzle NZ, and an inert gas is supplied to the slit nozzle NZ to discharge all of the liquid material inside the slit nozzle NZ.

The control device CONT uses the removal unit 60 to discharge the liquid material from the slit nozzle NZ. More specifically, the control device CONT opens the valve provided in the connection part 61 to drive the pumping mechanism, and discharges the liquid material ejected at the dummy ejection position from the connection part 61. At this time, the bubble sensor provided at the dummy ejection position or the timer provided in the control device CONT may be used to confirm whether or not the liquid material at the dummy ejection position have all been discharged. By these operations, the liquid material inside the chamber CB is removed. After all of the liquid material at the dummy discharge position has been removed, the control device CONT stops driving of the pumping mechanism in the connection part 61, and closes the valve (not shown).

In the removing step, the control device CONT performs an operation to discharge oxygen inside the chamber CB (discharging step). In the discharging step, the control device CONT performs the same operation as in the aforementioned inert gas supplying step to discharge oxygen inside the chamber CB. The control device CONT may perform the discharging step at the same time as the removing step or after the removing step.

In the present embodiment, since the connection part 61 is connected to the recovery part 62, the liquid material removed in the removing step is recovered by the recovery part 62 (recovering step). For example, when the detection result of the oxygen concentration sensor 31 falls below the first threshold value (i.e., when the oxygen concentration satisfies the requirement oxygen concentration<first threshold value), the control device CONT drives a pumping mechanism (not shown) provided in the circulation part 63 to supply the liquid material within the recovery part 62 to the circulation part 63. More specifically, the control device CONT performs an operation to return the liquid material to the slit nozzle NZ via the circulation part 63 (returning step). By this operation, the removed liquid material is returned to the slit nozzle NZ, so that there is no need to use a new liquid material. As a result, the amount of the liquid material used can be reduced.

On the other hand, when the oxygen concentration inside the chamber CB exceeds the second threshold value (i.e., when the oxygen concentration satisfies the requirement second threshold value<oxygen concentration), all operations of the coating apparatus CTR are stopped. When the oxygen concentration becomes high, it is sometimes preferable to perform an emergency stop of the coating apparatus CTR itself prior to removing the liquid material. In this manner, the liquid material can be more reliably recovered while maintaining the properties of the coating film of the liquid material. In such a case, for example, even when coating of the substrate is being performed, or the substrate S is being transported, the operation is stopped.

As described above, according to the present embodiment, since the coating apparatus includes the removal unit 60 which removes the liquid material from the inside of the chamber CB when the oxygen concentration inside the chamber exceeds the first threshold value, deterioration of the liquid material by the influence of oxygen can be prevented. As a result, it is possible to prevent deterioration in the film quality of the coating film formed using the liquid material.

The technical scope of the present invention is not limited to the above-described embodiment, but may be appropriately modified into various forms without departing from the spirit of the present invention.

In the above-described embodiment, the oxygen concentration inside the chamber CB is detected, and the removing step is performed on the basis of the detection result. However, the present invention is not limited to such a configuration, and for example, the humidity inside the chamber CB may be detected, and the removing step may be performed on the basis of the detected humidity. In this case, for example, the chamber CB is provided with a humidity sensor in addition to the oxygen concentration sensor 31. Alternatively, a humidity sensor may be disposed instead of the oxygen concentration sensor 31. Furthermore, when both of the oxygen concentration sensor 31 and the humidity sensor are used, a first threshold value and a second threshold value may be predetermined for both of the oxygen concentration and the humidity, or either one of the oxygen concentration and the humidity.

Moreover, in the above-described embodiment, the control device CONT stops all operations of the coating apparatus CTR when the value detected by the oxygen concentration sensor 31 exceeds the second threshold value. However, the present invention is not limited to such a configuration. For example, after the control device CONT stops all operations, only the inert gas supplying step may be performed, so as to discharge oxygen inside the chamber. When the oxygen concentration falls below the second threshold value as a result of discharging oxygen, the control device CONT may perform the removing step in the same manner as in the above-described embodiment.

In the above-described embodiment, the coating part CT includes the slit nozzle NZ, but the present invention is not limited thereto. For example, a dispenser coating part or an ink jet coating part may be used. Alternatively, for example, the liquid material disposed on the substrate S may be diffused by using a squeezer or the like so as to be coated thereon.

In the above-described embodiment, the slit nozzle NZ constituting the coating part CT is fixed, but the present invention is not limited thereto. For example, a moving mechanism which moves the slit nozzle NZ may be provided so as to move the slit nozzle NZ.

In the above-described embodiment, the roller members 50 are used as the substrate transporting part TR, but the present invention is not limited thereto. For example, the substrate S may be transported by using a floating mechanism to lift the substrate S. In this case, the floating mechanism may be selectively disposed in an area where the slit nozzle NZ is disposed inside the chamber CB. By such a configuration, it is possible to precisely control the film thickness of the coating film formed on the substrate S.

While preferred embodiments of the present invention have been described and illustrated above, it should be understood that these are exemplary of the present invention and are not to be considered as limiting. Additions, omissions, substitutions, and other modifications can be made without departing from the spirit or scope of the present invention. Accordingly, the present invention is not to be considered as being limited by the foregoing description, and is only limited by the scope of the appended claims.

What is claimed is:

1. A solar cell coating system comprising:
   a coating part including a slit nozzle which applies a liquid material including an oxidizable metal to a first substrate by a non-spin coating method;
   a chamber having a coating space in which the coating part applies the liquid material to the first substrate and a transport space into which the substrate is transported;
   a sensor detecting at least one of the following oxygen concentration or humidity inside the chamber;
   a removal unit which removes the liquid material from the inside of the chamber when at least one of the following oxygen concentration or humidity inside the chamber exceeds a first threshold value; and
   a controller programmed to control the operation of the removal unit on the basis of a detection result obtained by the sensor,
   wherein the controller is programmed to control the removal unit so that the liquid material is not removed until the coating part finishes coating the first substrate when the at least one of the following oxygen concentration or humidity exceeds the first threshold value,
   wherein the removal unit comprises a recovery part which recovers a recovered liquid material, said recovered liquid material is the liquid material moved from inside the chamber to outside the chamber, wherein the recovery part comprises a circulation path which returns the recovered liquid material into the chamber, and
   wherein the removal unit comprises a discharge unit which discharges oxygen or moisture from the chamber, depending on which of the following oxygen concentration or humidity inside the chamber exceeds the first threshold value.

2. The solar cell coating system according to claim 1, wherein the controller is programmed to stop a second substrate from being transported to the coating part after the coating of the first substrate has been completed.

3. The solar cell coating system according to claim 1, wherein the controller is programmed to control the removal unit to wait removing the liquid material until the coating part is moved to a maintenance position after the first substrate has been coated.

4. The solar cell coating system according to claim 1, wherein the controller is programmed to stop all treatments associated with coating of the liquid material when the at least one of oxygen concentration and humidity exceeds a second threshold value which is larger than the first threshold value.

* * * * *